(12) United States Patent
Mayer et al.

(10) Patent No.: US 6,929,168 B2
(45) Date of Patent: Aug. 16, 2005

(54) METHOD FOR DETERMINING OPTIMUM BONDING PARAMETERS FOR BONDING WITH A WIRE BONDER

(75) Inventors: Michael Mayer, Neuheim (CH); Jürg Schwizer, Pfaffnau (CH)

(73) Assignee: ESEC Trading SA, Cham (CH)

( * ) Notice: Subject to any disclaimer, the term of this patent is extended or adjusted under 35 U.S.C. 154(b) by 99 days.

(21) Appl. No.: 10/357,023

(22) Filed: Feb. 3, 2003

(65) Prior Publication Data

US 2003/0146265 A1 Aug. 7, 2003

(30) Foreign Application Priority Data

Feb. 1, 2002 (CH) .............................................. 0187/02

(51) Int. Cl.⁷ ......................... B23K 31/12; B23K 31/00; B23K 31/02
(52) U.S. Cl. ...................... 228/103; 228/102; 228/180.5
(58) Field of Search ................................ 228/102, 103, 228/104, 1.1, 4.5, 180.5

(56) References Cited

U.S. PATENT DOCUMENTS

| | | | |
|---|---|---|---|
| 3,458,921 A | * 8/1969 | Christensen | 228/102 |
| 3,523,360 A | * 8/1970 | Moore | 228/110.1 |
| 4,479,386 A | 10/1984 | Beggs et al. | |
| 4,586,642 A | 5/1986 | Dreibelbis et al. | |
| 4,597,519 A | * 7/1986 | Kurtz et al. | 228/102 |
| 4,815,001 A | 3/1989 | Uthe et al. | |
| 4,854,494 A | * 8/1989 | von Raben | 228/102 |
| 4,998,664 A | 3/1991 | Gibson et al. | |
| 5,586,713 A | * 12/1996 | Arita et al. | 228/102 |
| 5,832,412 A | * 11/1998 | Guez | 702/75 |
| 5,884,834 A | * 3/1999 | Vinson et al. | 228/102 |
| 5,884,835 A | * 3/1999 | Kajiwara et al. | 228/110.1 |
| 6,279,810 B1 | * 8/2001 | Chan-Wong et al. | 228/1.1 |
| 6,308,881 B1 | 10/2001 | Hesse et al. | |
| 6,648,205 B2 | * 11/2003 | Mayer et al. | 228/102 |
| 6,724,128 B2 | * 4/2004 | Cheng et al. | 310/328 |
| 2004/0079790 A1 | * 4/2004 | Mayer et al. | 228/180.5 |

FOREIGN PATENT DOCUMENTS

| | | |
|---|---|---|
| DE | 41 31 565 A 1 | 3/1993 |
| DE | 101 10 048 A 1 | 9/2002 |
| EP | 0 540 189 A2 | 5/1993 |
| EP | 0 786 323 A1 | 7/1997 |
| EP | 0 953 398 A1 | 11/1999 |

OTHER PUBLICATIONS

Mayer et al.; "Active Test Chips for In Situ Wire Bonding Process Characterisation", Technical Programmes of SEMI-CON, Singapore May 7–11, 2001, pp. 17–26, SINGAPORE.

Schwizer et al.; "Thermosonic Ball Bonding: Friction Model Based on Integrated Microsensor Measurements", IEEE Intl. Electronic Manufacturing Technology Symposium IEMT'99, Austin, Texas, Oct. 18–19, 1999, pp. 108–114, Texas, USA.

Mayer et al.: "In–Situ Ultrasonic Stress Measurements During Ball Bonding Using Integrated Piezoresistive Microsensors", EEP–vol. 26–1, Advances in Electronic Packaging—1999, vol. 1, ASME 1999, pp. 973–978, USA.

* cited by examiner

*Primary Examiner*—Lynne R. Edmondson
(74) *Attorney, Agent, or Firm*—McCormick, Paulding & Huber LLP

(57) ABSTRACT

A method for finding optimum bond parameters for a bond force $F_B$ and an ultrasonic variable P and, optionally, at least one further bond parameter of a wire bonder uses a sensor sensitive to a shear force exerted by the capillary on a connection point. A predetermined number of bonding operations with varying bonding parameters is performed. Optimum bond parameters are derived from the signal of the sensor.

10 Claims, 3 Drawing Sheets

METHOD FOR DETERMINING OPTIMUM BONDING PARAMETERS FOR BONDING WITH A WIRE BONDER

The present application claims priority under 35 U.S.C § 119 based upon Swiss Patent Application No. 2002 0187/02 filed on Feb. 1, 2002 which is incorporated herein by reference.

FIELD OF THE INVENTION

The invention concerns a method for determining optimum bond parameters when bonding with a Wire Bonder.

BACKGROUND OF THE INVENTION

A Wire Bonder is a machine with which wire connections are made to semiconductor chips after they have been mounted on a substrate. The Wire Bonder has a capillary which is clamped to the tip of a horn. The capillary serves to secure the wire to a connection point on the semiconductor chip and to a connection point on the substrate as well as to guide the wire between the two connection points. On making the wire connection between the connection point on the semiconductor chip and the connection point on the substrate, the end of the wire protruding from the capillary is first melted into a ball. Afterwards, the wire ball is secured to the connection point on the semiconductor chip by means of pressure and ultrasonics. In doing so, ultrasonics are applied to the horn from an ultrasonic transducer. This process is known as ball bonding. The wire is then pulled through to the required length, formed into a wire loop and welded to the connection point on the substrate. This last process is known as wedge bonding. After securing the wire to the connection point on the substrate, the wire is torn off and the next bond cycle can begin.

The ball bonding is influenced by various factors. In order to achieve bond connections of a predetermined quality, the adequate values of several physical and/or technical parameters must be determined for a particular process. Examples of such parameters are:

- the bond force, that is the normal force which the capillary exerts on the ball bond or the connection point of the semiconductor chip during the bonding process,
- a parameter, designated herein as ultrasonic variable P, which controls the application of ultrasonics to the ultrasonic transducer. The ultrasonic variable is, for example, the amplitude of the alternating current which flows through the ultrasonic transducer of the horn or the amplitude of the alternating voltage which is applied to the ultrasonic transducer, or the power, or another variable,
- a time duration, designated herein as ultrasonic time T, which indicates the length of time that the ultrasonic variable P is applied to the ultrasonic transducer,
- the impact velocity of the capillary on the connection point,
- a binary parameter that indicates whether the ultrasonic variable is already applied to the ultrasonic transducer before the capillary impacts on the connection point.

A method for determining optimum bond parameters is known from U.S. Pat. No. 3,458,921. With this method, several bonding operations are carried out whereby the bond parameters to be optimised are each varied in a predefined range in discrete steps. Afterwards, the connections are subjected to a shear or pull test and that bonding operation is determined which gave the best test results.

SUMMARY OF THE INVENTION

The object of the invention is to develop a method for easily determining optimum bond parameters.

Optimum bond parameters for a bond force $F_B$ and an ultrasonic variable P and, optionally at least one further bond parameter of a Wire Bonder, can be determined in accordance with the invention by means of a method with the following steps:

a) Carrying out several bonding operations, with which an end of a wire formed into a ball is bonded onto a connection point, whereby the bond force $F_B$ and the ultrasonic variable P and, if necessary, the at least one further bond parameter are each varied in discrete steps in a predefined range, whereby during bonding, for each bonding operation an electrical signal is produced by means of a sensor which is proportional to a shear force exerted on the corresponding connection point, b) for each bonding operation, determining a quantity G from the electrical signal delivered by the sensor during the bonding operation, c) Determining the maximum value of the quantity G and the corresponding values for the bond force $F_B$, the ultrasonic variable P and, if necessary, the at least one further bond parameter or determining a global maximum of the quantity G and determining the corresponding values for the bond force $F_B$, the ultrasonic variable P and, if necessary, the at least one further bond parameter or determining a range H for the quantity G in which the quantity G fulfills predefined criteria, and determining a value for the bond force $F_B$, the ultrasonic variable P and, if necessary, the at least one further bond parameter, which lie in the range H.

Examples of the quantity G are physical variables which depend on the shear force such as for example the friction energy output during the bonding operation or the thermal energy transferred to the semiconductor chip during the bonding operation or the energy put in the formation of the inter-metallic connection between the gold wire and the contact area during the bonding operation or the relative change of the friction coefficient, the maximum occurring shear force, etc. With the term shear force is meant the force directed parallel to the surface of the connection point which is exerted on the connection point as the result of the friction of the wire ball on the connection point. This force component is also designated as tangential force.

The advantage of the invention lies in that quality tests such as normal pull and shear tests which are performed on external equipment become superfluous.

BRIEF DESCRIPTION OF THE DRAWING FIGURES

The accompanying drawings, which are incorporated into and constitute a part of this specification, illustrate one or more embodiments of the present invention and, together with the detailed description, serve to explain the principles and implementations of the invention. The figures are not to scale.

DESCRIPTION OF THE PREFERRED EMBODIMENTS

Figure 1:
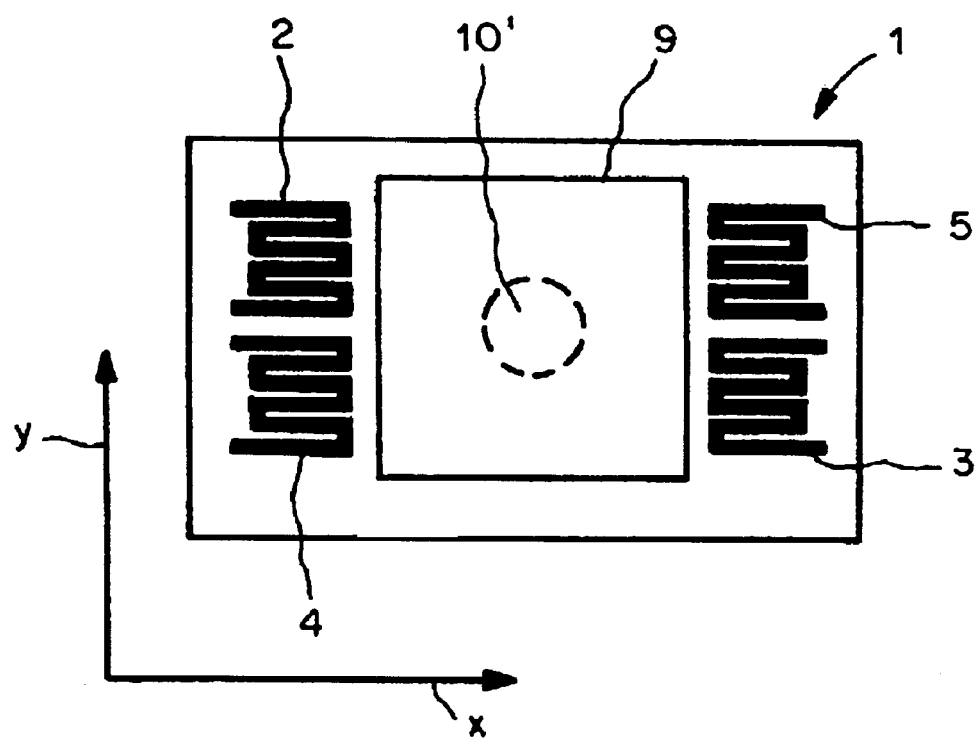
FIGS. 1, 2 show a piezoresistive sensor.
Figure 2:
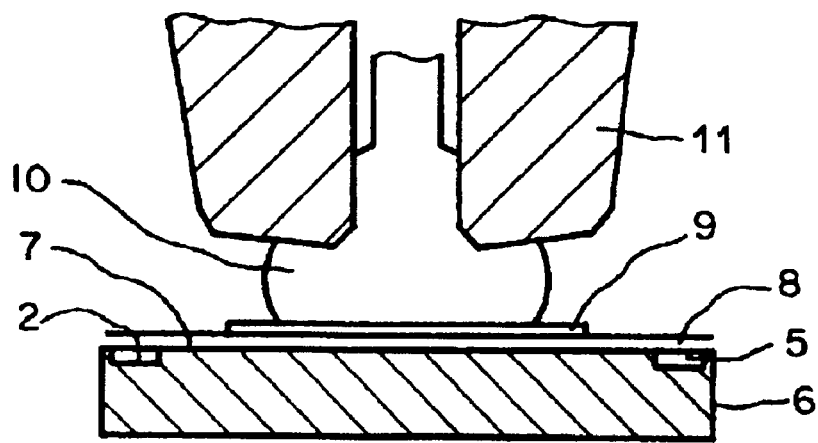

FIGS. 1 and 2 show a plan view and a cross-section of a sensor 1 integrated into a semiconductor chip which comprises four piezoresistive elements 2 to 5, which are electrically connected into a Wheatstone bridge. The output signal of the sensor 1 corresponds to the output signal of the Wheatstone bridge. The sensor 1 preferably consists of n-doped silicon 6 in one surface 7 of which the piezoresistive elements 2 to 5 are embedded as square-wave shaped resistive paths made of p-doped silicon. The surface 7 of the sensor 1 is covered with an insulation layer 8. The piezoresistive elements 2 to 5 are arranged outside an approximately square metallic contact area 9 within which the tip of the capillary 11 of a Wire Bonder presses the wire melted into a ball onto the semiconductor chip. The area where the ball bond 10 ideally presses onto the sensor 1 is represented by a broken circular ring 10'. In FIG. 1 the axes of a cartesian system of co-ordinates are designated x and y. The x direction preferably runs parallel to an [110] axis of the silicon crystal. The square-wave shaped paths of the piezoresistive elements 2 to 5 run in x direction and are arranged to the left and right outside the contact area 9 as seen in x direction. They serve the acquisition of the shear force $F_x$ induced by the ball bond in the sensor 1 in x direction on application of ultrasonics. On measurement, the sensor 1 should be orientated in relation to the Wire Bonder so that the direction of oscillation of the capillary 11 runs as far as possible parallel to the x direction.

Figure 3:
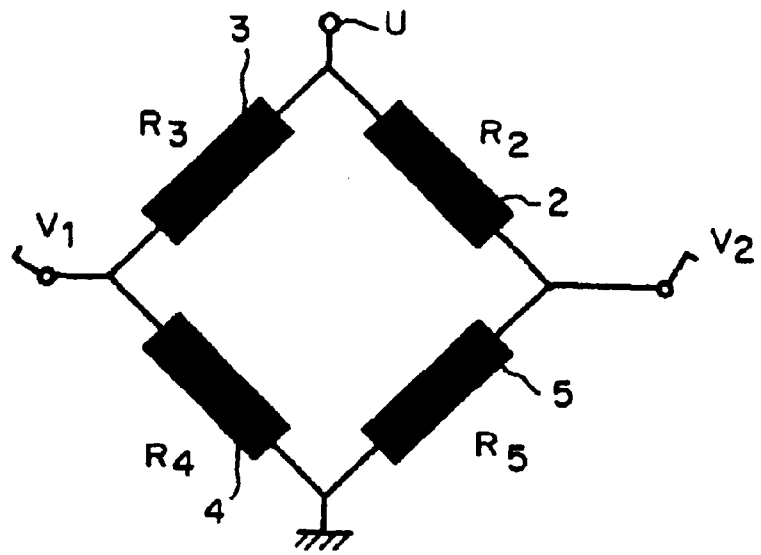
FIG. 3 shows an electrical circuit diagram of the sensor.

FIG. 3 shows the electrical circuit diagram of the Wheatstone bridge formed from the four piezoresistive elements 2 to 5. The four piezoresistive elements 2 to 5 are wired via customary conductors made of aluminium. The Wheatstone bridge is preferably supplied from a constant-voltage source with a voltage U. The output voltage $U_{Out}=V_1-V_2$ of the Wheatstone bridge then results in $$U_{Out} = \frac{R_2 R_4 - R_3 R_5}{(R_3 + R_4)*(R_2 + R_5)} U, \quad (1)$$

whereby $R_2$ to $R_5$ designate the ohmic resistances of the piezoresistive elements 2 to 5.

Figure 4:
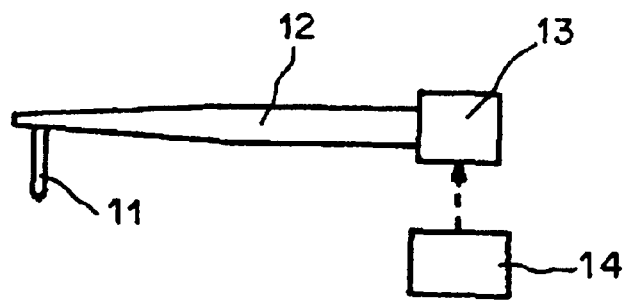
FIG. 4 shows parts of a Wire Bonder.

FIG. 4 shows schematically parts of a Wire Bonder, namely a horn 12, at the tip of which the capillary 11 is clamped, an ultrasonic transducer 13 formed from piezo elements and a power source 14 supplying the ultrasonic transducer 13.

In the following, the method in accordance with the invention for determining optimum bond parameters for the bond force $F_B$, an ultrasonic variable P and, optionally, at least one further bond parameter is now explained in detail. The first step of the method consists in that a predefined number of bonding operations is carried out whereby the bond force $F_B$ and the ultrasonic variable P and, if necessary, further bond parameters are varied in discrete steps in a predefined range. Each bonding operation is monitored by means of at least one sensor. The signal delivered by the sensor is stored and evaluated. In doing so, a quantity G characterising the bonding operation is determined from the sensor signal. The following examples show how the friction energy output during the bonding operation, the thermal energy transferred to the semiconductor chip during the bonding operation, and the relative change in the friction coefficients can be determined.

For the sake of simplicity, in the following example only the bond force $F_B$ is varied in n=1 . . . h steps and the ultrasonic variable P is varied in m=1 . . . k steps. Each of the each bonding operations is therefore assigned a bond force $F_n$ and an ultrasonic variable $P_m$, as well as a still to be determined quantity $G_{n,m}$. An example of the ultrasonic variable P is the amplitude of the alternating current flowing through the ultrasonic transmitter, i.e, each value $P_m$ then corresponds to an amplitude $I_m$. With each bonding operation, the capillary 11 is placed onto a new contact area 9 and a ball bond is bonded. This usually takes place as follows:

1. The capillary 11 is placed onto a new contact area 9.
2. The predefined bond force $F_n$ is applied to the capillary.
3. As soon as the bond force $F_n$ has built up, a constant alternating current $P_m=I(t)=I_m*\cos(2*\pi*f*t)$ with the given amplitude $I_m$ and the frequency f is applied to the ultrasonic transducer. The signal delivered by a sensor assigned to one of the contact areas 9 during the bonding operation is acquired and evaluated, i.e, for each bonding operation the characteristic quantity $G_{n,m}$ is determined from the signal delivered by the sensor.

In the following, different examples for the characteristic quantity $G_{n,m}$ and its calculation from the signal delivered by the sensor are now explained in more detail.

EXAMPLE 1

With this example, the quantity $G_{n,m}$ is the friction energy $W_{n,m}$ output during a bonding operation or a variable proportional to it. For determnining $G_{n,m}$, a semiconductor chip is used which contains numerous contact areas 9 each with an assigned sensor in accordance with FIG. 1. A different contact area 9 is used for each of the h*k bonding operations. During one single bonding operation, the signal $U_{Out}(t)$ delivered by the sensor assigned to the contact area 9 used is acquired and evaluated.

Figure 5:
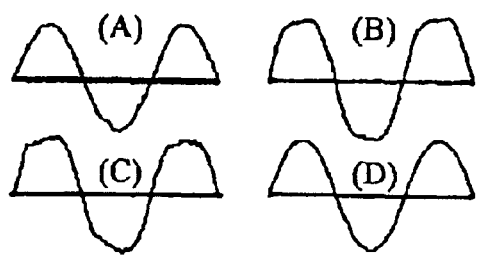
FIG. 5 shows waveforms of the signal of the piezoresistive sensor during a bonding process.

FIG. 5 shows the waveform of the signal $U_{Out}(t)$ at different points in time during the bonding process. The horizontal axis designates the time axis t. At the beginning and end of the bonding process, the waveform is almost sinusoidal (curves A and D). In an intermediate phase on the other hand, a flattening of the waveform occurs (curves B and C). This is synonymous with the occurrence of harmonic waves. A physical model for this behaviour can be taken from the article "Active test chips for in situ wire bonding process characterisation" which was presented and published in the conference report of the Semicon Singapore 2001 on the occasion of the "Advanced Packaging Technologies Seminar I". A further reference to this physical model is the following: J. Schwizer, M. Mayer, D. Bolliger, O. Paul, and H. Baltes, "Thermosonic Ball Bonding: Friction Model Based on Integrated Microsensor Measurements", conference report of the 24th IEEE/CPMT Intl. Electronic Manufacturing Technology Symposium IEMT'99 in Austin, Tex., Oct. 18–19, 1999, pp. 108–114.

Figure 6:
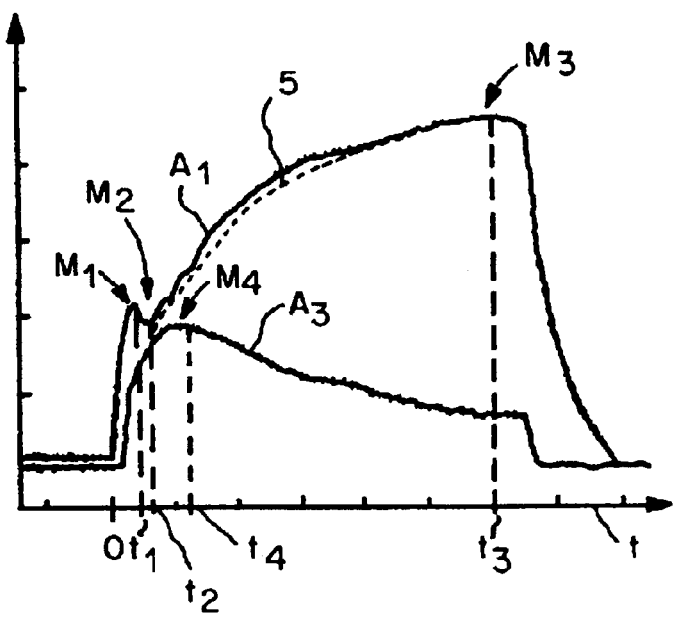
FIG. 6 shows signals derived from the signal of the piezoresistive sensor.
Figure 7:
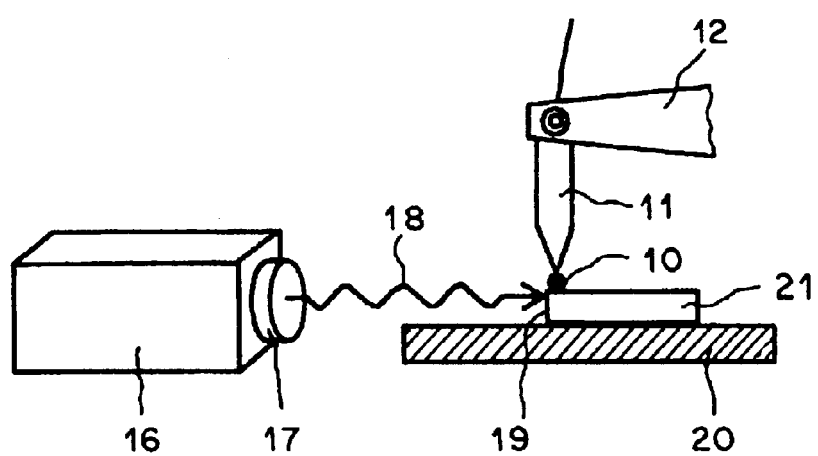
FIG. 7 shows a measuring arrangement with a vibrometer as sensor.

The signal $U_{Out}(t)$ delivered by the respective sensor oscillates with the frequency f of the alternating current flowing through the ultrasonic transducer 13. FIG. 6 shows schematically the envelope curve S(t) of the signal $U_{Out}(t)$ (broken line), the envelope curve of the first harmonic $A_1(t)$ and the envelope curve of the third harmonic $A_3(t)$ of the signal $U_{Out}(t)$. The signal $A_3(t)$ is presented magnified five times. When the ultrasonics is switched on at point in time $t_0=0$, then the signal S(t) increases, passes through a local maximum $M_1$ at point in time $t_1$, a local minimum $M_2$ at point in time $t_2$ and then increases further until a global maximum $M_3$ is reached at a point in time $t_3$. The local maximum $M_1$ indicates that the friction between the bond wire and the contact area now begins. For this reason, the third harmonic now occurs the envelope curve $A_3(t)$ of which at first increases, reaches a maximum $M_4$ at point in time $t_4$ then decreases again and finally remains at an almost constant level. The reaching of the constant level indicates that the bonding operation can be concluded. From the time characteristic of signals $S(t)$, $A_1(t)$ and $A_3(t)$, the friction energy $W_{n,m}$ output during the bonding operation is determined as:

$$W_{n,m} = \int_{t_a}^{t_b} Q(t)dt, \tag{1}$$

whereby here the point in time $t_a$ designates the start of friction, the point in time $t_b$ the end of friction and $Q(t)$ the friction energy.

Taking the stick-slip model described in the above-mentioned articles as a basis, a relationship can be deduced between the friction energy $Q(t)$ and the signals $S(t)$, $A_1(t)$ and $A_3(t)$. The friction energy $Q(t)$ can be roughly presented by $$Q(t) = k*[S^2(t)*(h^{-1}(t)-1)] \tag{2}$$

whereby the variable $h(t)$ designates a variable dependent on the relationship $a_3(t) = A_3(t)/A_1(t)$ and $k$ a constant. For $h(t)$ the relationship $$h(t) = b_1*a_3^3(t) + b_2*a_3^2(t) + b_3*a_3(t) + b_0 \tag{3}$$

has been found with the constants $b_1=1.4587$, $b_2=-2.1090$, $b_3=-2.4655$ and $b_0=1.0006$.

For the calculation of the friction energy $W_{n,m}$ in accordance with equation (1), the points in time $t_a$ and $t_b$ now have to be determined. As already mentioned, it appears from the physical point of view that the connection growth takes place when the signal of the sensor reaches the local minimum $M_2$ at point in time $t_2$. The point in time $t_2$ can therefore be selected for the point in time $t_a$. For a similar reason, the point in time at which the signal $A_3(t)$ is almost constant can be selected for the point in time $t_b$. With the example in FIG. 6, this point in time coincides with point in time $t_3$. Or, the point in time at which the signal $A_3(t)$ is less than a predefined amount of the maximum value $A_{3max}$ of $A_3(t)$, e.g., at $A_3(t) < 0.5*A_{3max}$ or at $A_3(t) < 0.25*A_{3max}$, can be used for the point in time $t_b$.

It can happen that the local maximum $M_1$ and the local minimum $M_2$ do not occur but that only the increase in the signal $S(t)$ changes. These changes are however sufficiently prominent so that in this case instead of the point in time $t_1$ at which otherwise the local maximum $M_1$ occurs an equivalent point in time $t_{10}$ can be determined at which the increase in the signal $S(t)$ quite abruptly becomes flatter, as well as instead of point in time $t_2$ at which otherwise the local minimum $M_2$ occurs, an equivalent point in time $t_{20}$ can be determined at which the increase in the signal $S(t)$ quite abruptly becomes steeper. The point in time $t_{10}$ can then be selected for point in time $t_a$.

In this way, from the equations (1), (2) and (3), a quantity $G_{n,m}$ can be determined for each bonding operation characterised by the indices n and m which is linked to the friction energy $W_{n,m}$ by means of the still unknown constant $k$ occurring in equation (2):

$$G_{n,m} = W_{n,m}/k \tag{4}$$

From the h*k friction energies $W_{n,m}$ the whole number indices $n_1$ and $m_1$ can now be determined for that bonding operation for which the quantity $G_{n1,m1}$ is at a maximum. The indices $n_1$ and $m_1$ therefore indicate with which bond parameters the greatest friction energy is achieved. Alternatively, the evaluation can also take place with normal mathematical methods in order to determine the global maximum of a polynomial function spanned by the quantity $G_{n,m}$ whereby the indices $n_1$ and $m_1$ can then be non-integer numbers. In this case, the corresponding optimum values for the bond force $F_B$ and for the parameter P of the ultrasonic transducer can subsequently be determined by means of interpolation.

Preferably however, the optimum bond parameters are determined in such a way that bond connections with the required quality can be produced during production even when the effective bond parameters deviate from their set values as the result of unavoidable tolerances. Therefore, for the bond parameter, that range B in which the values $G_{n,m}$ are greater than a predefined minimum value $G_0$ is determined first. Afterwards, within the range B, those values which give the greatest possible robustness to tolerance-dependent deviations are selected as optimum bond parameters.

It is now advantageous, from the values $G_{n,m}$ to determine the corresponding shear force or, if necessary, the shear strength which is defined as shear force per contact area. Shear force and shear strength are generally accepted quality parameters for ball-bond connections. On the assumption that the shear force $F_S$ which is necessary in order to shear off the ball bond bonded onto the respective contact area 9 is proportional to the friction energy output during the bonding operation, i.e., on the assumption that $F_S = \alpha*W$ is valid, whereby the variable $\alpha$ is a constant and the variable W designates the friction energy corresponding to the shear force $F_S$, with this method one therefore gets those bond parameters with which the greatest shear force can be achieved.

When the optimum bond parameters have been determined, then, by means of a shear test, it can be checked whether the bond balls bonded with the optimum bond parameters really achieve the shear strength required for the corresponding bonding process. Furthermore, the constant a can be determined by means of a shear test. Once the constant $\alpha$ is known, then, with later optimising processes, not only can those bond parameters which result in the maximum shear force be determined but a range can even be determined for the bond parameters within which a predefined shear force is achieved. Therefore, a range can also be determined for the quantity G and the corresponding values for the bond force $F_B$, the ultrasonic variable P and, if necessary, the at least one further bond parameter in which range the quantity G fulfills predefined criteria.

When the optimum bond parameters have been determined, then the length of time during which the supply of ultrasonics is necessary for the bonding operation can also be derived from the signals delivered by the sensor. The supply of ultrasonics can namely be terminated as soon as the point in time $t_b$, which can be determined as described above, is reached.

Another presentation of the friction energy $Q(t)$ at interval $[t_2, t_3]$ is $$Q(t) = 4*f*F_x(t)*[A_0 - k_S*F_x(t)] \tag{5}$$

whereby f designates the frequency of the ultrasonics, $A_0$ the amplitude of the freely oscillating under side of the ball bond (ball), $F_x$ the shear force exerted on the respective contact point and $k_S$ a constant characterising the rigidity of the system "capillary—gold ball—contact area", whereby the rigidity is inversely proportional to $k_S$.

On the assumption that the sensor signal S(t) is proportional to the shear force $F_x(t)$, i.e., $$S(t)=F_x(t)/S_0 \qquad (6)$$

whereby the variable $s_0$ is a constant, the friction energy Q(t) given in equation (1) can be presented as $$Q(t)=q_1*S(t)+q_2*S^2(t) \qquad (7)$$

whereby $q_1$ and $q_2$ are constants which are given by:

$$q_1=4*f*A_0*S_0 \qquad (8)$$

$$q_2=-4*f*k_S*S_0^2 \qquad (9)$$

The constant $s_0$ can be determined by means of a calibration with a shear testing device in that the shear force measured by the shear testing device is compared with the signal delivered simultaneously by the sensor on shearing off a ball bond bonded onto the contact area of the sensor. The amplitude $A_0$ of the freely oscillating under side of the ball bond can be roughly determined, for example, with a vibrometer in that one measures the amplitude of the freely oscillating tip of the capillary.

The constant $k_S$ can be determined from the shape of the measured signal S(t). The shear force $F_x(t)$ and the bond force $F_n$ are linked by the equation $$F_x(t)=\mu(t)*F_n \qquad (10)$$

whereby $\mu(t)$ is designated as friction coefficient. The friction coefficient $\mu(t)$ increases with increasing strength of the connection between ball bond and contact area. On the plausible assumption that the speed of development of the connection, i.e., the rate of change of the friction coefficient $\mu(t)$, after passing through the local minimum $M_2$ is proportional to the friction energy:

$$d\mu(t)/dt=k_B*Q(t), \qquad (11)$$

whereby the variable $k_B$ designates the proportionality constant, from the equations (6) to (11) one gets a differential equation for the sensor signal S(t) with the analytical solution $$S_c(t) = \frac{c_1 * e^{c_1 t}}{\frac{c_1}{S(t_2)} - c_2 * e^{c_1 t}}, \qquad (12)$$

whereby the constants $c_1$ and $c_2$ are given by:

$$c_1=4*f*A_0*F_n*k_B \qquad (13)$$

$$c_2=-4*f*k_S*F_n*k_B \qquad (14).$$

By means of fitting the sensor signal S(t) to the function $S_c(t)$ given by means of equation (12) in the interval $[t_2, t_3]$ or in a smaller interval $[t_2, t_3-r*(t_3-t_2)]$, whereby r is a factor between 0 and 1, one gets the constants $k_B$ and $k_S$. In this way, the friction energy can be determined from the sensor signal S(t) as an absolute variable in accordance with the equations (1) and (7)–(9).

Even when with this second alternative only the enveloping curve S(t) of the sensor signal $U_{Out}(t)$ is necessary in order to determine the friction energy $W_{n,m}$, it is however advantageous to use the enveloping curve $A_1(t)$ of the first harmonic and/or the enveloping curve $A_3(t)$ of the third harmonic in order to determine the point in time $t_b$ which marks the end of the integration interval according to equation (1).

EXAMPLE 2

With this example, the relative change $\Delta\mu$ in the friction coefficient $\mu(t)$ between the ball bond and the contact area is used as the characteristic quantity $G_{n,m}$. The same sensor as with the first example serves as the sensor. The friction coefficient $\mu(t)$ is linked to the enveloping curve S(t) of the output signal $U_{Out}(t)$ of the sensor via the relationship:

$$S(t)=t(t)*F_n/S_0 \qquad (15)$$

whereby $S_0$ designates a constant and $F_n$ the actual bond force. The quantity $G_{n,m}$ can be calculated from the enveloping curve S(t) as:

$$G_{n,m} = \Delta\mu_{n,m} = \frac{2M_3}{M_1 + M_2} \qquad (16)$$

whereby the value $M_1$ designates the first local maximum, the value $M_2$ the first local minimum and the value $M_3$ the global maximum of the enveloping curve S(t) (see FIG. 6). If the local maximum $M_1$ and the local minimum $M_2$ do not occur, then, in place of these, those values are used where each time the steepness of curve S(t) abruptly changes, as has already been explained in the first example.

Alternatively, the following relationships can also be used for the characterisation of the relative change $\Delta\mu$ of the friction coefficient $\mu(t)$:

$$G_{n,m} = \Delta\mu_{n,m} = \frac{M_3}{M_1} \qquad (17)$$

$$G_{n,m} = \Delta\mu_{n,m} = \frac{M_3}{M_2} \qquad (18)$$

$$G_{n,m} = \Delta\mu_{n,m} = (M_3 - M_1)*s_0/F_n \qquad (19)$$

EXAMPLE 3

The maximum $M_3$, which the sensor signal S(t) reaches during the bonding operation is also suitable for determining the optimum bond parameters:

$$G_{n,m}=\max(S_{n,m}(t))=M_3 \qquad (1)$$

In accordance with the equations (10) and (16), the value $M_3$ corresponds to the maximum shear force.

For the determination of the friction energies $W_{n,m}$ according to the first example, instead of the sensor in accordance with FIG. 1, an external sensor can also be used, in particular a vibrometer 16 which makes non-contact measurement of the surface oscillations on the basis of laser Doppler vibrometry. A suitable vibrometer is marketed, for example, by the company Polytec. FIG. 8 shows schematically the use of the vibrometer. The measuring head 17 of the vibrometer 16 emits a laser beam 18 which preferably impinges at a vertical angle on a side face 19 of the semiconductor chip 21 mounted on a substrate 20, where it is reflected and again impinges on the measuring head 17 of the vibrometer 16. The laser beam 18 preferably impinges in the vicinity of the upper edge of the side face 19. The contact areas, onto which bonding takes place, are arranged in the vicinity of the side face 19 so that the oscillations transferred from the capillary to the semiconductor chip make the side face 19 oscillate. The vibrometer 16 delivers a signal of equal quality as the sensor according to FIG. 1 and the evaluation can therefore take place in the same way as with example 1.

The advantage of the vibrometer lies in that the optimum bond parameters can be determined for any semiconductor chip, in particular for those without an integrated sensor. The vibrometer can therefore also be used for continuous monitoring of bonding during production and the Wire Bonder can be set up to give an alarm when the measured quantity G falls below a predefined minimum value.

Furthermore, it is possible that a piezoelectric sensor is mounted on the horn, in particular in the area of the mounting flange with which the horn is secured to the bondhead of the Wire Bonder, whereby the sensor must be designed so that it delivers a signal correlated to the tangential force $F_x$.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims and their equivalents.

What is claimed is:

1. A method for determining optimum bond parameters for a bond force $F_B$ and an ultrasonic variable P and, optionally, at least one further bond parameter of a Wire Bonder for a bonding process, comprising the steps of:
   a) Carrying out several bonding operations, with which an end of a wire formed into a ball is bonded onto a connection point, whereby the bond force $F_B$ and the ultrasonic variable P and, if necessary, the at least one further bond parameter are each varied in discrete steps in a predefined range, whereby during bonding, for each bonding operation an electrical signal is produced by means of a sensor which signal is proportional to a shear force exerted on the corresponding connection point,
   b) for each bonding operation, determining a quantity G from the electrical signal delivered by the sensor during the bonding operation,
   c) Determining a maximum value of the quantity G and corresponding values for the bond force $F_B$, the ultrasonic variable P and, if necessary, the at least one further bond parameter, or determining a global maximum of the quantity G and determining corresponding values for the bond force $F_B$, the ultrasonic variable P and, if necessary, the at least one further bond parameter, or determining a range H for the quantity G in which the quantity G fulfills predefined criteria and determining a value for each of bond force $F_B$, ultrasonic variable P and, if necessary, the at least one further bond parameter, which lie in the range H.

2. The method according to claim 1, wherein bonding occurs onto a contact area of a semiconductor chip, and wherein the sensor is a piezoresistive sensor integrated into the semiconductor chip.

3. The method according to claim 1, wherein a friction energy Q(t) is derived from the signal delivered by the sensor, and wherein the quantity G corresponds to a friction energy output during the bonding operation.

4. The method according to claim 2, wherein a friction energy Q(t) is derived from the signal delivered by the sensor, and wherein the quantity G corresponds to a friction energy output during the bonding operation.

5. The method according to claim 1, wherein bonding occurs onto a contact area of a semiconductor chip, and wherein the quantity G corresponds to a maximum of the electrical signal produced during the bonding operation.

6. The method according to claim 1, wherein a ball bond is bonded onto a contact area of a semiconductor chip and wherein the quantity G corresponds to a change in a friction coefficient between the ball bond and the contact area which change takes place during the bonding operation.

7. The method according to claim 1, wherein a vibrometer serves as the sensor which sends a laser beam onto a side face of a semiconductor chip.

8. The method according to claim 3, wherein a vibrometer serves as the sensor which sends a laser beam onto a side face of the semiconductor chip.

9. The method according to claim 5, wherein a vibrometer serves as the sensor which sends a laser beam onto a side face of the semiconductor chip.

10. The method according to claim 6, wherein a vibrometer serves as the sensor which sends a laser beam onto a side face of the semiconductor chip.

* * * * *

UNITED STATES PATENT AND TRADEMARK OFFICE
CERTIFICATE OF CORRECTION

PATENT NO. : 6,929,168 B2
DATED : August 16, 2005
INVENTOR(S) : Michael Mayer and Jurg Schwizer It is certified that error appears in the above-identified patent and that said Letters Patent is hereby corrected as shown below:

Column 9,
Lines 23 and 24, delete "and, optionally, at least one further bond parameter".
Lines 28 and 31, delete "whereby" and insert -- such that --.
Lines 29 and 30, delete "and, if necessary, the at least one further bond paramter".
Line 40, after the comma, insert -- and --.
Lines 41 and 42, delete "and, if necessary, the at least one further bond parameter,".

Column 10,
Line 2, after the comma, insert -- and --.
Lines 3-4 and 7-8, delete "and, if necessary, the at least one further bond parameter,".
Line 6, after the comma, insert -- and the --.

Signed and Sealed this

Twenty-fourth Day of January, 2006

JON W. DUDAS
*Director of the United States Patent and Trademark Office*